United States Patent
Kang et al.

(10) Patent No.: US 9,166,098 B2
(45) Date of Patent: Oct. 20, 2015

(54) NITRIDE SEMICONDUCTOR LIGHT EMITTING DEVICE

(75) Inventors: Sang Won Kang, Suwon (KR); Seong Ju Park, Gwangju (KR); Min Ki Kwon, Gwangju (KR); Sang Jun Lee, Gwangju (KR); Joo Young Cho, Gwangju (KR); Yong Chun Kim, Seongnam (KR); Sang Heon Han, Suwon (KR); Dong Ju Lee, Suwon (KR); Jeong Tak Oh, Yongin (KR); Je Won Kim, Seoul (KR)

(73) Assignees: Samsung Electronics Co., Ltd., Seoul (KR); Gwangju Institute of Science and Technology, Gwangju (KR)

( * ) Notice: Subject to any disclaimer, the term of this patent is extended or adjusted under 35 U.S.C. 154(b) by 903 days.

(21) Appl. No.: 12/338,496

(22) Filed: Dec. 18, 2008

(65) Prior Publication Data

US 2010/0019223 A1 Jan. 28, 2010

(30) Foreign Application Priority Data

Jul. 22, 2008 (KR) ........................ 10-2008-0071299

(51) Int. Cl.
*H01L 33/00* (2010.01)
*H01S 5/30* (2006.01)
*H01S 5/00* (2006.01)
*H01S 5/32* (2006.01)
*H01L 33/06* (2010.01)
*H01L 33/02* (2010.01)
*H01L 33/32* (2010.01)

(52) U.S. Cl.
CPC .............. *H01L 33/06* (2013.01); *H01L 33/025* (2013.01); *H01L 33/32* (2013.01)

(58) Field of Classification Search
USPC .............. 257/86, E21.121, E21.126, E29.078
See application file for complete search history.

(56) References Cited

U.S. PATENT DOCUMENTS

| | | | | |
|---|---|---|---|---|
| 5,932,896 A | * | 8/1999 | Sugiura et al. | 257/94 |
| 6,072,189 A | * | 6/2000 | Duggan | 257/14 |
| 6,649,942 B2 | * | 11/2003 | Hata et al. | 257/103 |
| 7,244,964 B2 | * | 7/2007 | Hata | 257/87 |
| 7,312,480 B2 | * | 12/2007 | Hata et al. | 257/102 |
| 7,417,258 B2 | * | 8/2008 | Hooper et al. | 257/86 |
| 7,504,274 B2 | * | 3/2009 | Chakraborty et al. | 438/46 |
| 8,686,466 B2 | * | 4/2014 | Farrell et al. | 257/103 |
| 8,759,813 B2 | * | 6/2014 | Hirayama | 257/13 |
| 2003/0081642 A1 | * | 5/2003 | Hwang et al. | 372/45 |

(Continued)

FOREIGN PATENT DOCUMENTS

| | | |
|---|---|---|
| JP | 08-111558 A | 4/1996 |
| JP | 11-340559 A | 12/1999 |

(Continued)

*Primary Examiner* — Mary Wilczewski
*Assistant Examiner* — Tsz Chiu
(74) *Attorney, Agent, or Firm* — McDermott Will & Emery LLP

(57) ABSTRACT

There is provided a nitride semiconductor light emitting device including an active layer of a multi quantum well structure, the nitride semiconductor light emitting device including: a substrate; and a buffer layer, an n-type nitride semiconductor layer, an active layer and a p-type nitride semiconductor layer sequentially stacked on the substrate, wherein the active layer is formed of a multi quantum well structure where a plurality of barrier layers and a plurality of well layers are arranged alternately with each other, and at least one of the plurality of barrier layers includes a first barrier layer including a p-doped barrier layer doped with a p-dopant and an undoped barrier layer.

19 Claims, 4 Drawing Sheets

(56) References Cited

U.S. PATENT DOCUMENTS

| | | |
|---|---|---|
| 2005/0008053 A1* | 1/2005 | Witzigmann et al. ........... 372/43 |
| 2005/0156153 A1* | 7/2005 | Futagawa ........................ 257/14 |
| 2005/0161688 A1* | 7/2005 | Biwa et al. ..................... 257/94 |
| 2005/0170542 A1* | 8/2005 | Matsumura ..................... 438/31 |
| 2006/0268953 A1 | 11/2006 | Ikedo et al. |
| 2007/0246736 A1 | 10/2007 | Senda et al. |

FOREIGN PATENT DOCUMENTS

| | | |
|---|---|---|
| JP | 2000-208875 | 7/2000 |
| JP | 2000-332364 A | 11/2000 |
| JP | 2001-102629 A | 4/2001 |
| JP | 2006-310488 | 11/2006 |
| KR | 10-2008-0060638 A | 7/2008 |

* cited by examiner

NITRIDE SEMICONDUCTOR LIGHT EMITTING DEVICE

CROSS-REFERENCE TO RELATED APPLICATIONS

This application claims the priority of Korean Patent Application No. 2008-71299 filed on Jul. 22, 2008, in the Korean Intellectual Property Office, the disclosure of which is incorporated herein by reference.

BACKGROUND OF THE INVENTION

1. Field of the Invention

The present invention relates to a nitride semiconductor device including an active layer of a multi quantum well structure, and more particularly, to a nitride semiconductor light emitting device including an active layer of a multi quantum well structure, in which a barrier layer adjacent to a p-type nitride semiconductor layer is Mg-doped into a p-doped barrier layer to prevent electrons from overflowing and accordingly improve hole injection efficiency, thereby enhancing external quantum efficiency.

2. Description of the Related Art

Recently, nitride semiconductor devices have been under development and have seen their applications broadened from a mobile phone keypad and a side view light source to general lightings and car headlights.

A light emitting diode (LED) used as a mobile phone utilizes an operating current of 20 mA. However, an LED for use in lightings and car headlights generally requires hundreds of mA of operating current to be supplied thereto. This supplied current of hundreds of mA entails problems which have been unobserved in a low current. A representative problem pertains to the efficiency droop.

In general, efficiency of the LED is represented by external quantum efficiency, which is a value obtained by multiplying photon extraction efficiency by internal quantum efficiency. Under the efficiency droop, the external quantum efficiency is decreased with an increase in the operating current.

In the conventional LED of a multi quantum well structure, efficiency droop occurs at a current density of about 10 A/cm$^2$. That is, external quantum efficiency is gradually decreased at an operating current greater than the current density of 10 A/cm$^2$. The current density is varied according to an area of the LED chip but the current density of 10 A/cm$^2$ can be converted into the operating current of about 20 mA.

That is, as for the LED for use in a mobile phone, in the case of a current of 20 mA or more, a higher operating current leads to less efficiency of the LED. Therefore, the efficiency droop should be necessarily overcome to employ the LED in the lightings and car headlights requiring a high current density.

Specifically, in the conventional LED having a multi quantum well structure, the active layer includes an InGaN layer, i.e., well layer where light is emitted and a GaN layer, i.e., barrier layer. The well layer usually employs an undoped layer and the barrier layer employs an undoped layer or a Si-doped n-GaN layer.

The barrier layer is Si-doped to improve interface characteristics between the well layer and the barrier layer. Also, the Si-doping reduces resistance to decrease an operating voltage at a forward voltage. Moreover, the Si-doping increases concentration of electrons, thereby serving to screen a piezoelectric field caused by stress resulting from differences in lattice constant between the InGaN layer as the well layer and the GaN layer as the barrier layer.

This also reduces blue shift caused by an increase in the operating current. The screening effect ensures a reduction in band bending induced by piezoelectric field and allows for more overlapping of wave functions between the electrons and holes to enhance internal quantum efficiency.

This method has been used mostly to increase LED efficiency at a low current density. However, this does not prevent efficiency droop from occurring at a high current density as required by lightings and car headlights.

Furthermore, due to lower mobility of holes than electrons in general, the holes are injected into the active layer of the LED with low efficiency. On the contrary, the electrons are injected into the active layer well due to small effective mass and subsequently great mobility thereof.

Therefore, the holes are injected poorly while the electrons injected well migrate through the active layer over to the p-type nitride semiconductor layer. This phenomenon is aggravated at a high current density, i.e., by higher concentration of electrically injected carriers. This phenomenon leads to a decline in external quantum efficiency at a higher current density.

To improve this phenomenon, an electron blocking layer formed of AlGaN with great bandgap may be stacked on the active layer. This however does not prevent the electrons from overflowing since the electron block layer cannot serve as a barrier properly due to piezoelectric field arising from differences in lattice constant.

As described above, in the conventional LED having the multi quantum well structure, the holes are injected with low efficiency from a low current density to a high current density. Also, the external quantum efficiency is degraded due to nonradiative Auger recombination resulting from a high carrier concentration at a high current density.

SUMMARY OF THE INVENTION

An aspect of the present invention provides a nitride semiconductor light emitting device in which a barrier layer is Mg-doped to confine electrons more effectively and holes can be effectively injected into a well layer where light is emitted.

An aspect of the present invention also provides a nitride semiconductor light emitting device in which an undoped barrier layer is formed before and behind an Mg-doped barrier layer to thereby prevent diffusion of Mg doped in the barrier.

According to an aspect of the present invention, there is provided a nitride semiconductor light emitting device including: a substrate; and a buffer layer, an n-type nitride semiconductor layer, an active layer and a p-type nitride semiconductor layer sequentially stacked on the substrate, wherein the active layer is formed of a multi quantum well structure where a plurality of barrier layers and a plurality of well layers are arranged alternately with each other, and at least one of the plurality of barrier layers includes a first barrier layer including a p-doped barrier layer doped with a p-dopant and an undoped barrier layer.

The first barrier layer may be adjacent to the p-type nitride semiconductor layer.

Each of the plurality of barrier layers may include the first barrier layer.

The first barrier layer may include the p-doped barrier layer and the undoped barrier layer sequentially stacked, the p-doped barrier layer formed of a p-doped nitride semiconductor and the undoped barrier layer formed of an undoped nitride semiconductor.

The first barrier layer may include the undoped barrier layer and the p-doped barrier layer sequentially stacked, the undoped barrier layer formed of an undoped nitride semiconductor and the p-doped barrier layer formed of a p-doped nitride semiconductor.

The first barrier layer may further include another undoped barrier layer provided on the p-doped barrier layer to be sequentially stacked, the another undoped barrier layer formed of an undoped nitride semiconductor.

The p-dopant may be one of Mg, Zn, Be, Ca, Sr and Ba. The p-dopant may have a doping concentration of $10^{15}/cm^3$ to $10^{20}/cm^3$. The p-doped barrier layer may be grown to have a doping concentration inclined or stepped.

The active layer may further include a plurality of second barrier layers doped with an n-dopant in an area adjacent to the n-type nitride semiconductor layer.

Each of the second barrier layers may include an n-doped barrier layer doped with the n-dopant and an undoped barrier layer.

The each of the second barrier layers may include the n-doped barrier layer and the undoped barrier layer sequentially stacked, the n-doped barrier layer formed of an n-doped nitride semiconductor and the undoped barrier layer formed of an undoped nitride semiconductor.

The each of the second barrier layers may include the undoped barrier layer and the n-doped barrier layer sequentially stacked, the undoped barrier layer formed of an undoped nitride semiconductor and the n-doped barrier layer formed of an n-doped nitride semiconductor.

The each of the second barrier layers may further include another undoped barrier layer provided on the n-doped barrier layer to be stacked sequentially, the another undoped barrier layer formed of an undoped nitride semiconductor.

The n-dopant may be one of Si, Ge, Se, Te and C. The p-dopant may be one of Mg, Zn, Be, Ca, Sr and Ba.

The n-dopant may be doped with a doping concentration of $10^{15}/cm^3$ to $10^{20}/cm^3$. The p-dopant may be doped with a doping concentration of $10^{15}/cm^3$ to $10^{20}/cm^3$.

BRIEF DESCRIPTION OF THE DRAWINGS

The above and other aspects, features and other advantages of the present invention will be more clearly understood from the following detailed description taken in conjunction with the accompanying drawings, in which:

FIG. 2 schematically illustrates a change in a band structure when a barrier layer of an active layer of a nitride semiconductor light emitting device is Mg-doped according to an exemplary embodiment of the invention, in which

DETAILED DESCRIPTION OF THE PREFERRED EMBODIMENT

Exemplary embodiments of the present invention will now be described in detail with reference to the accompanying drawings.

Figure 1:
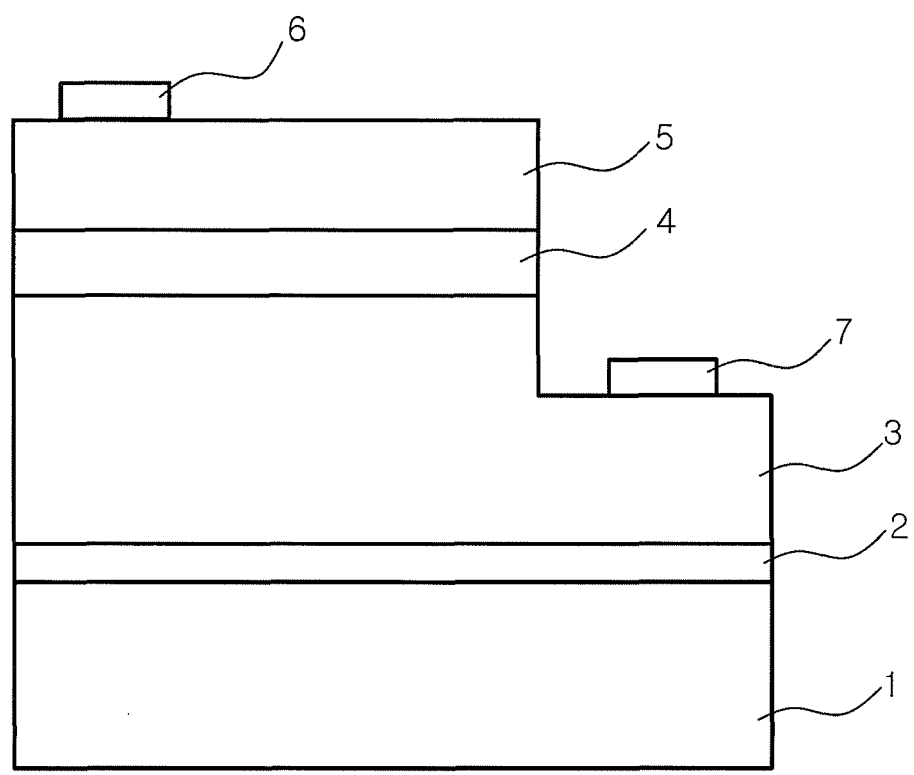
FIG. 1 is a cross-sectional view illustrating a structure of a nitride semiconductor light emitting device according to an exemplary embodiment of the invention.

FIG. 1 is a cross-sectional view illustrating a structure of a nitride semiconductor light emitting device according to an exemplary embodiment of the invention.

As shown in FIG. 1, the nitride semiconductor light emitting device includes a substrate 1, and a buffer layer 2, an n-type nitride semiconductor layer 3, an active layer 4 of a multi quantum well structure, and a p-type nitride semiconductor layer 5 sequentially stacked on the substrate 1. Electrodes 6 and 7 are formed on the n-type nitride semiconductor layer 3 and the p-type nitride semiconductor layer 5, respectively. This allows light to be emitted from the active layer 4 by recombination of holes and electrons injected from the semiconductor layers 3 and 5. Here, the light emitted from the active layer 4 is radiated toward the p-type nitride semiconductor layer 5.

Hereinafter, components of the nitride semiconductor light emitting device shown in FIG. 1 will be described in more detail.

The substrate 1 chiefly utilizes a sapphire substrate in view of lattice mismatch with a material of a nitride semiconductor grown thereon. This sapphire substrate allows a nitride semiconductor material to be grown relatively easily and stays stable at a high temperature.

The n-type nitride semiconductor layer 3 formed on a top of the substrate 1 may be made of an n-doped semiconductor material. A representative example of the nitride semiconductor material includes GaN, AlGaN, and InGaN. A dopant for doping the n-type nitride semiconductor layer 3 may employ Si, Ge, Se, Te or C, and particularly, Si.

To form the n-type nitride semiconductor layer 3, the semiconductor material is grown on the substrate 1 by a known process such as metal organic vapor deposition (MOCVD), molecular beam epitaxy (MBE) and Hydride vapor phase epitaxy (HVPE).

In general, the buffer layer 2 may be formed between the substrate 1 and the n-type nitride semiconductor layer 3 to relax lattice mismatch. This buffer layer 2 utilizes a low temperature nucleus growth layer having tens of nm of thickness and made of GaN or AlN.

The active layer 4 serves to emit light and is formed of a multi quantum well structure (MQW) by growing an InGaN layer as a well layer and a GaN layer as a barrier layer. For example, a blue light emitting diode employs a multi quantum well structure of InGaN/GaN, and an ultraviolet ray light emitting diode utilizes a multi quantum well structure of GaN/AlGaN, InAlGaN/InAlGaN and InGaN/AlGaN. This will be described in great detail with reference to FIG. 2B.

A film thickness of the active layer 4 is not particularly limited, but the stacked number or stacked sequence of the well layer and barrier layer is adjusted in view of a desired wavelength of the LED device to control an entire film thickness of the active layer. That is, In or Al compositional ratio is changed to adjust a wavelength of light. Also, the depth of the well layer of the active layer, and the number and thickness of the active layer are changed to improve internal quantum efficiency of the light emitting diode.

In the same manner as the n-type nitride semiconductor layer 3, this active layer 4 is formed on the n-type nitride semiconductor layer 3 by a known deposition process such as MOCVD, MBE, and HVPE.

Like the n-type nitride semiconductor layer 3, the p-type nitride semiconductor layer 5 may be formed of a p-doped semiconductor material. A representative example of the nitride semiconductor material includes GaN, AlGaN, and InGaN. A dopant for doping the p-type nitride semiconductor layer 5 includes Mg, Zn or Be, and particularly, Mg.

This p-type nitride semiconductor layer 5 is formed by growing the semiconductor material on the active layer 4 by a known process such as MOCVD, MBE and HVPE.

The electrodes 6 and 7 includes a p-side bonding electrode 6 formed on a top of the p-type nitride semiconductor layer 5 and an n-side bonding electrode 7 formed on a top of the n-type nitride semiconductor layer 3.

Also, a transparent electrode layer may be additionally formed on an entire area of the top of the p-type nitride semiconductor layer 5, between the p-type nitride semiconductor layer 5 and the p-side bonding electrode 6. The transparent electrode layer needs to be formed of a material suitable for reducing contact resistance with the p-type nitride semiconductor layer 5 having a relatively high energy band gap and having good transmissivity enabling the light generated from the active layer 4 to be emitted upward. Generally, the transparent electrode layer may be formed of indium tin oxide (ITO), cadmium tin oxide (CTO) or titanium tungsten nitride (TiWN) to ensure light transmissivity. This transparent electrode layer may be formed by a known deposition process such as chemical vapor deposition (CVD) and E-beam evaporation or a process such as sputtering. The transparent electrode layer may be heat-treated at a temperature of about 400° C. to 900° C. to enhance ohmic contact characteristics.

The p-side bonding electrode 6 is formed on the p-type nitride semiconductor layer 5. The p-side bonding electrode 6 is an outermost electrode layer to be disposed on a lead by wire bonding. Generally, the p-side bonding electrode 6 is made of an alloy containing Au or Au and formed by a known deposition process such as chemical vapor deposition (CVD) and E-beam evaporation or a process such as sputtering.

The n-side bonding electrode 7 is formed of a single layer or a plurality of layers on the n-type nitride semiconductor layer 3 and made of a material selected from a group consisting of Ti, Cr, Al, Cu and Au. This n-side bonding electrode 7 is formed on the n-type nitride semiconductor layer 3 by a known deposition process such as CVD and E-beam evaporation or a process such as sputtering.

FIG. 2 schematically illustrates a change in a band structure when a barrier layer 24 of an active layer of the nitride semiconductor light emitting device of FIG. 1 is Mg-doped.

Figure 2A:
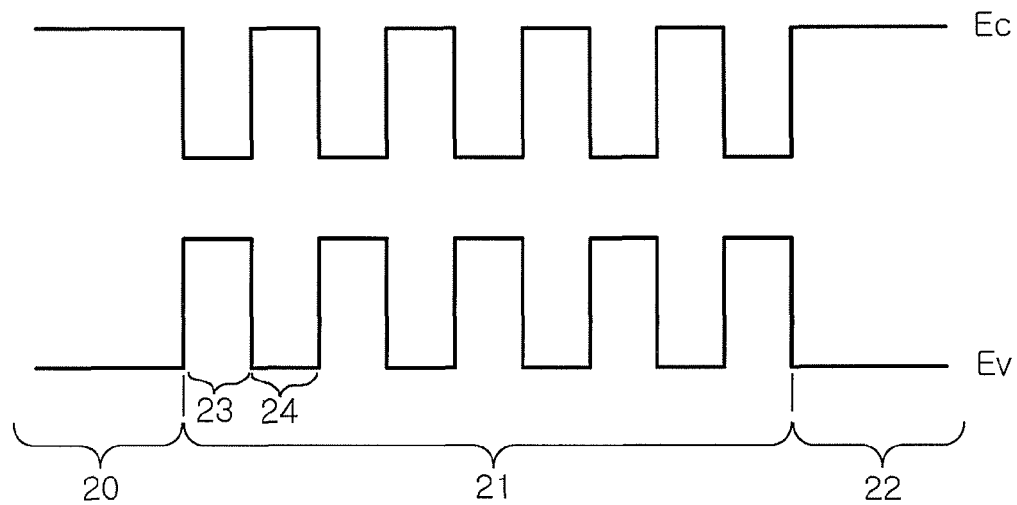
FIG. 2A is a schematic band gap diagram when the barrier layer is not Mg-doped and FIG. 2B is a schematic band gap diagram when the barrier layer is Mg-doped.
Figure 2B:
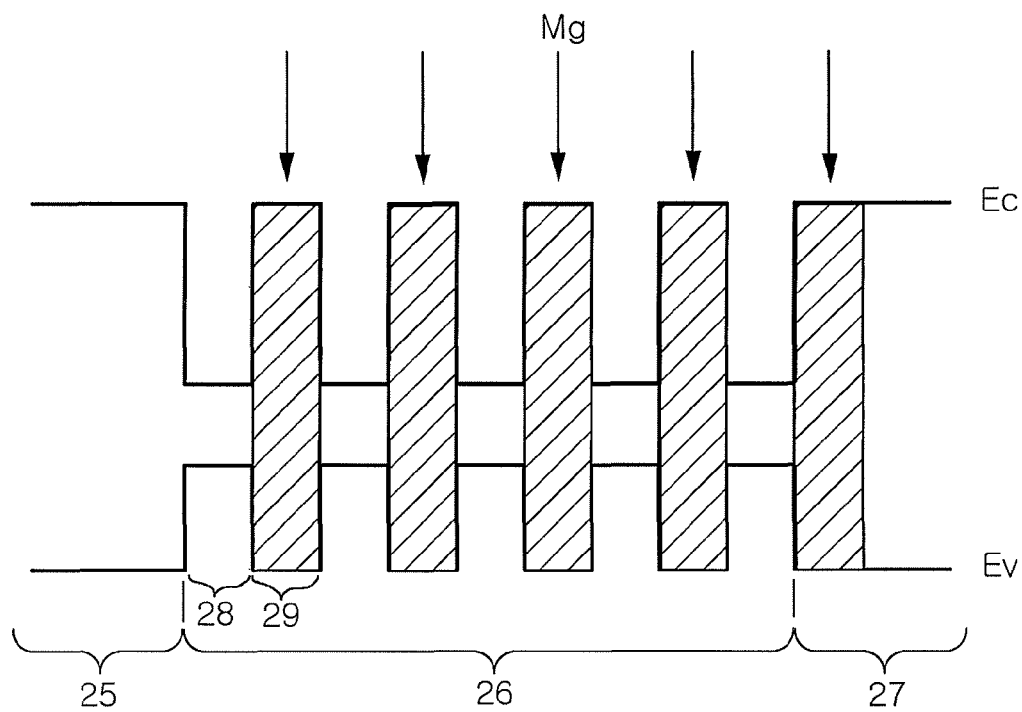

FIG. 2A is a schematic band gap diagram when the barrier layer 24 of the active layer 21 formed between an n-type nitride semiconductor layer 20 and a p-type nitride semiconductor layer 22 is not Mg-doped. FIG. 2B is a schematic band gap diagram when the barrier layer is Mg-doped. Hereinafter, the barrier layer or a well layer may be described as a singular number for convenience's sake but may be construed as a plurality of barrier layers or well layers, respectively if necessary.

As shown in FIG. 2B, the multi quantum well structure of the active layer 26 has a barrier layer 29 doped with Mg as a p dopant and an undoped well layer 28 sequentially stacked. The barrier layer 29 may be entirely or partially Mg-doped. At least a portion of the barrier layer most adjacent to the p-type nitride semiconductor layer 27 is Mg-doped.

That is, partial Mg-doping of the barrier layer can ensure holes to be injected into the well layer with higher efficiency. The p-dopant may be one of Mg, Zn, Be, Ca, Sr and Ba, and particularly, Mg. The p-dopant may be doped with a doping concentration of $10^{15}/cm^3$ to $10^{20}/cm^3$.

Specifically, in a case where the barrier layer 29 of the active layer 26 formed between the n-type nitride semiconductor layer 25 and the p-type nitride semiconductor layer 27 is Mg-doped, a depth of the well layer 28 for a conduction band is increased to further ensure electrons with higher mobility to be confined into the well layer. On the other hand, this decreases a depth of the well layer 28 in a valance band to ensure the holes to be injected with higher efficiency.

To prevent diffusion of Mg doped in the barrier layer 29 of the active layer, the undoped barrier layer may be grown before and behind the Mg-doped, i.e., p-doped barrier layer. For example, when the p-dopant is doped in the barrier layer, the active layer may have at least one of structures in which the Mg doped p-doped barrier layer and the undoped barrier layer are sequentially stacked, the undoped barrier layer and the Mg doped p-doped barrier layer are sequentially stacked, and the undoped barrier layer, Mg doped p-doped barrier layer and the undoped barrier layer are sequentially stacked. The structure of the active layer described above will be described in detail with reference to FIGS. 3 and 4.

Figure 3:
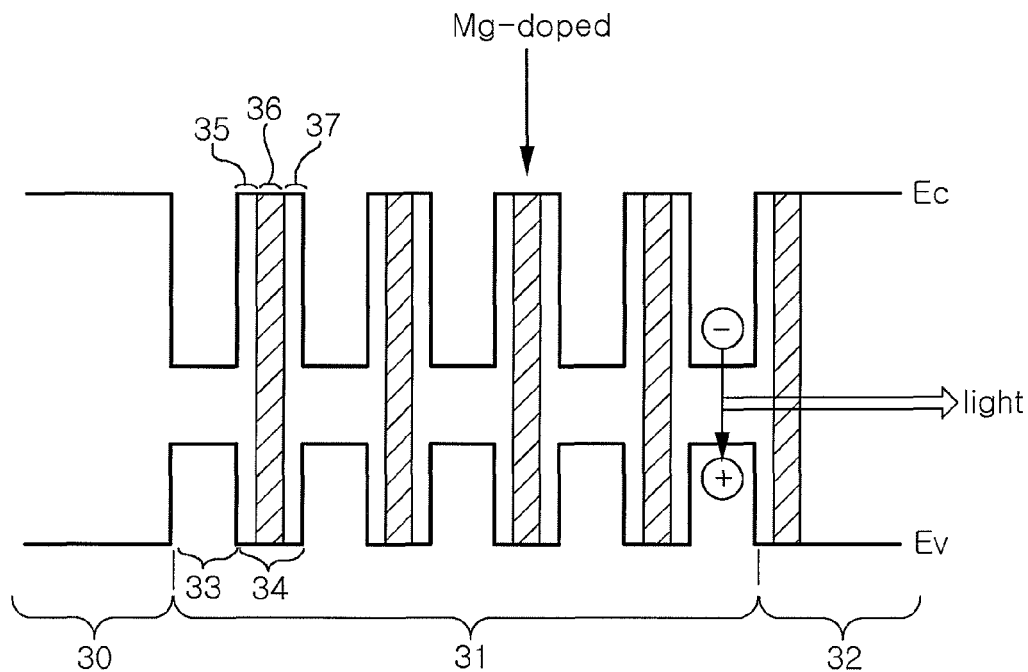
FIG. 3 schematically illustrates a quantum well band structure of an active layer of the nitride semiconductor light emitting device shown in FIG. 1.

FIG. 3 schematically illustrates a quantum well band structure of an active layer of the nitride semiconductor light emitting device shown in FIG. 1.

As shown in FIG. 3, in an active layer 31 having a multi quantum well structure, a barrier layer 34 is Mg doped into a p-doped barrier layer 36. Accordingly, holes not injected into the active layer 31 effectively from the p-type nitride semiconductor layer 32 due to low mobility thereof are directly injected from the barrier layer 34 into the well layer 33. This significantly improves light emitting efficiency of the nitride semiconductor light emitting device. Also, this prevents the electrons from overflowing to the p-type nitride semiconductor layer 32.

Meanwhile, in a general LED, light is emitted only in a corresponding one of well layers most adjacent to the p-type nitride semiconductor owing to high mobility of electrons. Thus, the barrier layer 34 formed into the p-doped barrier layer 36 also increases the number of the well layers where light is emitted. However, the Mg doped in the barrier layer 34 may be diffused into the well layer due to the higher growth temperature of the p-type nitride semiconductor layer grown after formation of the active layer. At this time, the Mg serves as a defect which degrades light emitting efficiency.

Therefore, in the present embodiment, undoped barrier layers 35 and 37 are grown before and behind the Mg-doped, i.e., p-doped barrier layer 36 of the barrier layer 34 to prevent the Mg from being diffused into the well layer 33. This consequently prevents a decline in light emitting efficiency resulting from the Mg diffusion.

Figure 4:
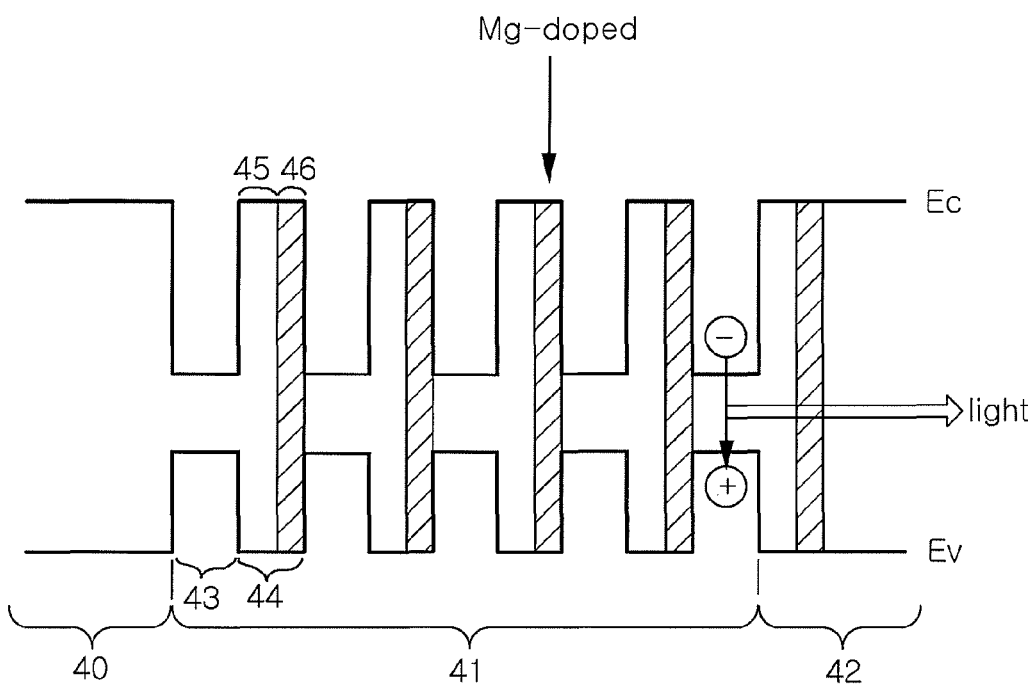
FIG. 4 schematically illustrates a quantum well band structure of an active layer according to an exemplary embodiment of the invention.

FIG. 4 schematically illustrates a structure of a quantum well band of an active layer according to another embodiment of the invention.

As shown in FIG. 4, in an active layer 41 of the present embodiment, to prevent Mg doped in a barrier layer 44 from being diffused into a well layer 43, an undoped barrier layer 45 can be grown on one side of the p-doped barrier layer 46 of the barrier layer 44 by Mg doping. As shown in FIG. 3, this structure also prevents a decline in light emitting efficiency resulting from the Mg diffusion.

Figure 5:
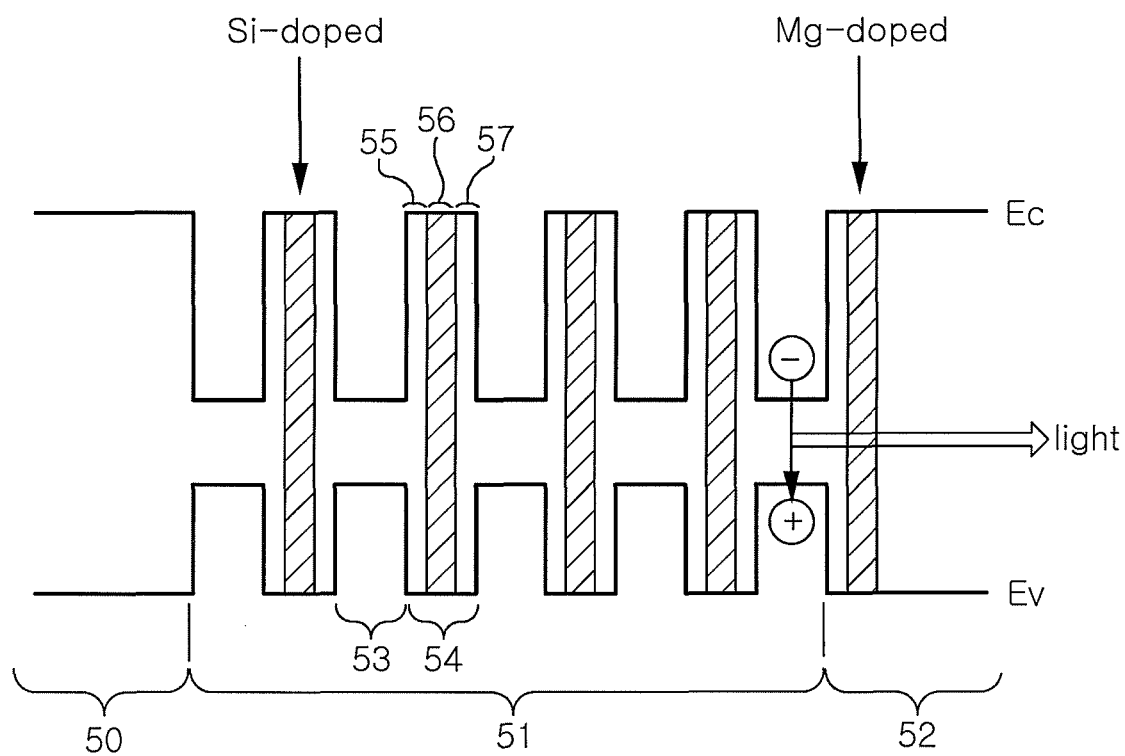
FIG. 5 schematically illustrates a change in a band structure when a barrier layer of an active layer of a nitride semiconductor light emitting device is Si-doped and Mg-doped according to another exemplary embodiment of the invention.

FIG. 5 schematically illustrates a change in a band structure when a barrier layer of an active layer of a nitride semiconductor light emitting device of another embodiment of the invention is Si- and Mg-doped.

General nonradiative recombination includes nonradiative Auger recombination caused by carrier concentration, shockley-read-hall recombination caused by a deep level in the band gap. The shockley-read-hall recombination is in proportion to carrier concentration but the Auger recombination is in proportion to a cubic root of the carrier concentration.

Therefore, with higher carrier concentration in the active layer resulting from high current density, the nonradiative Auger recombination in proportion to the cubic root of the carrier concentration is more likely to occur. Accordingly, this reduces external quantum efficiency at a high current density.

By virtue of Si doping, with higher concentration of carriers in the barrier layer, electrons of the barrier layer are more likely to be involved in nonradiative Auger recombination by interaction with carriers in the well layer. Moreover, in the case of the barrier layer that is not doped, a general undoped GaN with superior film quality has an electron density of $10^{16}/cm^3$. This is caused by nitrogen vacancy, which is the characteristic of GaN material.

This electron concentration of $10^{16}/cm^3$ is a growth condition of an undoped GaN layer grown on the buffer layer. Thus, under a different growth condition of the barrier layer in the active layer, the electron concentration may be similar to $10^{16}/cm^3$ or higher. In this case, electrons of the barrier layers are also likely to be involved in nonradiative Auger recombination.

Therefore, according to the present embodiment, as shown in FIG. 5, Mg is doped in a corresponding one of the barrier layers adjacent to the p-type nitride semiconductor layer 52 where light is mostly emitted in the active layer 51 or a portion of the barrier layers. Also, Si is doped in another corresponding one 54 of the barrier layers adjacent to the n-type nitride semiconductor layer 50 or another portion of the barrier layers.

This allows for a less increase in operating voltage of the light emitting device, which may occur when the barrier layer 54 functions like an insulator. Here, the n-dopant may be not only Si but also one of Ge, Se, Te and C. The p-dopant may be not only Mg but also one of Zn, Be, Ca, Sr and Ba.

Also, the n-dopant may be doped with a doping concentration of $10^{15}/cm^3$ to $10^{20}/cm^3$ and the p-dopant may be doped with a doping concentration of $10^{15}/cm^3$ to $10^{20}/cm^3$.

Moreover, the barrier layer 54 may be configured such that undoped barrier layers 55 and 57 may be grown before and behind a Si- or Mg-doped barrier layer 56. Alternatively, the undoped barrier layer 55 or 57 may be grown on only one side of the Si- or Mg-doped barrier layer 56.

As described above, the barrier layer is Mg doped to attain insulator-like characteristics. This considerably reduces carrier concentration to $10^{15}/cm^3$ or less, and thus renders carriers of the barrier layer much less likely to be involved in nonradiative Auger recombination. This consequently reduces nonradiative Auger recombination in a high current to ensure high quantum efficiency. In this case, Mg doping should be performed with lower doping concentration than the embodiments shown in FIGS. 2 to 4.

As set forth above, according to exemplary embodiments of the invention, a barrier layer is doped with a p-dopant to ensure a well layer can further confine electrons and allow holes to be injected into the well layer with higher efficiency. This assures a less decrease in external quantum efficiency of a light emitting device at a high current density.

Also, the p-dopant doped in the barrier layer is adjusted in doping concentration to reduce carrier concentration in the barrier layer and thus allow for less nonradiative Auger recombination. Accordingly, this assures a less decline in external quantum efficiency of the light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
   a substrate; and
   an n-type nitride semiconductor layer, an active layer and a p-type nitride semiconductor layer sequentially stacked on the substrate,
   wherein the active layer is formed of a multi quantum well structure where a plurality of barrier layers and a plurality of well layers are arranged alternately with each other,
   at least one of the plurality of barrier layers comprises a first barrier layer including a p-doped barrier layer doped with a p-dopant and at least one undoped barrier layer,
   the active layer comprises a plurality of second barrier layers doped with an n-dopant in an area adjacent to the n-type nitride semiconductor layer, and
   wherein the p-doped barrier layer doped with the p-dopant contacts at least one undoped barrier layer.

2. The nitride semiconductor light emitting device of claim 1, wherein the first barrier layer is adjacent to the p-type nitride semiconductor layer.

3. The nitride semiconductor light emitting device of claim 1, wherein each of the plurality of barrier layers comprises the first barrier layer.

4. The nitride semiconductor light emitting device of claim 1, wherein the first barrier layer comprises the p-doped barrier layer and the undoped barrier layer sequentially stacked, the p-doped barrier layer formed of a p-doped nitride semiconductor and the undoped barrier layer formed of an undoped nitride semiconductor.

5. The nitride semiconductor light emitting device of claim 1, wherein the first barrier layer comprises the undoped barrier layer and the p-doped barrier layer sequentially stacked, the undoped barrier layer formed of an undoped nitride semiconductor and the p-doped barrier layer formed of a p-doped nitride semiconductor.

6. The nitride semiconductor light emitting device of claim 5, wherein the first barrier layer further comprises another undoped barrier layer provided on the p-doped barrier layer to be stacked sequentially, the another undoped barrier layer formed of an undoped nitride semiconductor.

7. The nitride semiconductor light emitting device of claim 1, wherein the p-dopant comprises one of Mg, Zn, Be, Ca, Sr and Ba.

8. The nitride semiconductor light emitting device of claim 1, wherein the p-dopant has a doping concentration of $10^{15}/cm^3$ to $10^{20}/cm^3$.

9. The nitride semiconductor light emitting device of claim 1, wherein the p-doped barrier layer is grown to have a doping concentration inclined or stepped.

10. The nitride semiconductor light emitting device of claim 1, wherein each of the second barrier layers comprises an n-doped barrier layer doped with the n-dopant and an undoped barrier layer.

11. The nitride semiconductor light emitting device of claim 10, wherein the each of the second barrier layers comprises the n-doped barrier layer and the undoped barrier layer sequentially stacked, the n-doped barrier layer formed of an n-doped nitride semiconductor and the undoped barrier layer formed of an undoped nitride semiconductor.

12. The nitride semiconductor light emitting device of claim 10, wherein the each of the second barrier layers comprises the undoped barrier layer and the n-doped barrier layer sequentially stacked, the undoped barrier layer formed of an undoped nitride semiconductor and the n-doped barrier layer formed of an n-doped nitride semiconductor.

13. The nitride semiconductor light emitting device of claim 12, wherein the each of the second barrier layers further comprises another undoped barrier layer provided on the n-doped barrier layer to be stacked sequentially, the another undoped barrier layer formed of an undoped nitride semiconductor.

14. The nitride semiconductor light emitting device of claim 1, wherein the n-dopant comprises one of Si, Ge, Se, Te and C.

15. The nitride semiconductor light emitting device of claim 14, wherein the p-dopant comprises one of Mg, Zn, Be, Ca, Sr and Ba.

16. The nitride semiconductor light emitting device of claim 1, wherein the n-dopant is doped with a doping concentration of $10^{15}/cm^3$ to $10^{20}/cm^3$.

17. The nitride semiconductor light emitting device of claim 16, wherein the p-dopant is doped with a doping concentration of $10^{15}/cm^3$ to $10^{20}/cm^3$.

18. A nitride semiconductor light emitting device comprising:
a substrate;
an n-type nitride semiconductor layer over the substrate;
an active layer over the n-type nitride semiconductor layer, the active layer comprising a multi quantum well structure comprising a plurality of first barrier layers, a plurality of second barrier layers, and a plurality of well layers, the plurality of well layers arranged alternately with the plurality of first barrier layers and the plurality of second barrier layers, at least one of the plurality of first barrier layers comprises a first barrier layer including a p-doped barrier layer, at least one of the plurality of second barrier layers comprises a second barrier layer including an n-doped barrier layer; and
a p-type nitride semiconductor layer over the active layer.

19. A nitride semiconductor light emitting device comprising:
a substrate;
an n-type nitride semiconductor layer over the substrate;
an active layer over the n-type nitride semiconductor layer, the active layer comprising a multi quantum well structure comprising a plurality of first barrier layers, a plurality of second barrier layers, and a plurality of well layers, the plurality of well layers arranged alternately with the plurality of first barrier layers and the plurality of second barrier layers, at least one of the plurality of first barrier layers comprises a first barrier layer including a p-doped barrier layer adjacent to at least one undoped barrier layer, at least one of the plurality of second barrier layers comprises a second barrier layer including an n-doped barrier layer doped with an n-dopant in an area adjacent to the n-type nitride semiconductor layer; and
a p-type nitride semiconductor layer over the active layer.

* * * * *